US007002825B2

(12) United States Patent
Scheuerlein

(10) Patent No.: US 7,002,825 B2
(45) Date of Patent: Feb. 21, 2006

(54) WORD LINE ARRANGEMENT HAVING SEGMENTED WORD LINES

(75) Inventor: Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 11/103,184

(22) Filed: Apr. 11, 2005

(65) Prior Publication Data

US 2005/0180244 A1 Aug. 18, 2005

Related U.S. Application Data

(62) Division of application No. 10/403,844, filed on Mar. 31, 2003, now Pat. No. 6,879,505.

(51) Int. Cl.
*G11C 5/02* (2006.01)
*G11C 5/06* (2006.01)

(52) U.S. Cl. ...................... 365/51; 365/63; 365/230.06

(58) Field of Classification Search ..................... None
See application file for complete search history.

(56) References Cited

U.S. PATENT DOCUMENTS

| | | | | |
|---|---|---|---|---|
| 4,602,354 | A | | 7/1986 | Craycraft et al. |
| 4,646,266 | A | | 2/1987 | Ovshinsky et al. |
| 4,868,616 | A | | 9/1989 | Johnson et al. |
| 5,301,144 | A | | 4/1994 | Kohno |
| 5,315,541 | A | * | 5/1994 | Harari et al. .......... 365/185.13 |
| 5,429,968 | A | | 7/1995 | Koyama |
| 5,568,421 | A | | 10/1996 | Aritome |
| 5,621,683 | A | | 4/1997 | Young |
| 5,751,012 | A | | 5/1998 | Wolstenholme et al. |
| 5,835,396 | A | | 11/1998 | Zhang |
| 5,926,415 | A | | 7/1999 | Shin |
| 5,991,193 | A | | 11/1999 | Gallagher |
| 6,004,825 | A | | 12/1999 | Seyyedy |
| 6,005,270 | A | | 12/1999 | Noguchi |
| 6,034,882 | A | | 3/2000 | Johnson et al. |
| 6,055,180 | A | | 4/2000 | Gudesen et al. |
| 6,128,214 | A | | 10/2000 | Kuekes et al. |
| 6,130,835 | A | | 10/2000 | Scheuerlein |

(Continued)

FOREIGN PATENT DOCUMENTS

EP 0 073 486 3/1983

(Continued)

OTHER PUBLICATIONS

U.S. Appl. No. 10/326,470, filed on Dec. 19, 2002, entitled "An Improved Method for Making High-Density Nonvolatile Memory," naming inventors S. Brad Herner, Maitreyee and Michael A. Vyvoda.

(Continued)

*Primary Examiner*—Son L. Mai
(74) *Attorney, Agent, or Firm*—Zagorin O'Brien Graham LLP

(57) ABSTRACT

A three-dimensional (3D) passive element memory cell array provides short word lines while still maintaining a small support circuit area for efficiency. Short, low resistance word line segments on two or more word line layers are connected together in parallel to form a given word line without use of segment switch devices between the word line segments. A shared vertical connection preferably connects the word line segments together and connects to a word line driver circuit disposed generally below the array near the word line. Each word line driver circuit preferably couples its word line either to an associated one of a plurality of selected bias lines or to an unselected bias line associated with the driver circuit, which selected bias lines are themselves decoded to provide for an efficient multi-headed word line decoder.

21 Claims, 13 Drawing Sheets

U.S. PATENT DOCUMENTS

| | | | | |
|---|---|---|---|---|
| 6,163,048 | A | 12/2000 | Hirose et al. | |
| 6,185,121 | B1 | 2/2001 | O'Neill | |
| 6,185,122 | B1 | 2/2001 | Johnson et al. | |
| 6,324,093 | B1 | 11/2001 | Perner et al. | |
| 6,335,890 | B1 | 1/2002 | Reohr et al. | |
| 6,356,477 | B1 | 3/2002 | Tran | |
| 6,363,000 | B1 | 3/2002 | Perner et al. | |
| 6,420,215 | B1 | 7/2002 | Knall et al. | |
| 6,445,613 | B1 | 9/2002 | Nagai | |
| 6,452,860 | B1 * | 9/2002 | Wada et al. | 365/230.06 |
| 6,462,979 | B1 | 10/2002 | Schlösser et al. | |
| 6,473,328 | B1 | 10/2002 | Mercaldi | |
| 6,477,077 | B1 | 11/2002 | Okazawa | |
| 6,490,194 | B1 | 12/2002 | Hoenigschmid | |
| 6,498,747 | B1 | 12/2002 | Gogl et al. | |
| 6,515,888 | B1 | 2/2003 | Johnson et al. | |
| 6,522,594 | B1 | 2/2003 | Scheuerlein | |
| 6,525,953 | B1 | 2/2003 | Johnson | |
| 6,545,898 | B1 | 4/2003 | Scheuerlein | |
| 6,567,287 | B1 | 5/2003 | Scheuerlein | |
| 6,584,006 | B1 | 6/2003 | Viehmann | |
| 6,611,453 | B1 | 8/2003 | Ning | |
| 6,618,295 | B1 | 9/2003 | Scheuerlein | |
| 6,628,564 | B1 * | 9/2003 | Takita et al. | 365/230.06 |
| 6,631,085 | B1 | 10/2003 | Kleveland et al. | |
| 6,687,147 | B1 | 2/2004 | Fricke et al. | |
| 6,785,157 | B1 * | 8/2004 | Arimoto et al. | 365/149 |
| 6,882,557 | B1 * | 4/2005 | Kajigaya et al. | 365/63 |
| 6,912,152 | B1 * | 6/2005 | Iwata et al. | 365/158 |
| 2002/0028541 | A1 | 3/2002 | Lee et al. | |
| 2003/0027378 | A1 | 2/2003 | Kleveland et al. | |
| 2003/0128581 | A1 | 7/2003 | Scheuerlein et al. | |
| 2003/0235063 | A1 * | 12/2003 | Van Brocklin et al. | 365/51 |
| 2004/0002184 | A1 | 1/2004 | Cleeves | |
| 2004/0100852 | A1 | 5/2004 | Scheuerlein et al. | |
| 2004/0119122 | A1 | 6/2004 | Ikbahar et al. | |
| 2004/0124415 | A1 | 7/2004 | Walker et al. | |
| 2004/0125629 | A1 | 7/2004 | Scheuerlein et al. | |
| 2004/0188714 | A1 | 9/2004 | Scheuerlien et al. | |
| 2004/0190359 | A1 | 9/2004 | Scheuerlein et al. | |

FOREIGN PATENT DOCUMENTS

| | | |
|---|---|---|
| EP | 0 395 886 | 11/1990 |
| EP | 0 924 709 | 6/1999 |

OTHER PUBLICATIONS

Naji, Peter K., et al., "A 256kb 3.0V 1tIMTJ Nonvolatile Magnetoresistive RAM," 2001 IEEE ISSCC, Feb. 6, 2001, Paper 7.6, and associated slide handouts, 35 pages.

M. Durlam et al., "Nonvolatile RAM Based on Magnetic Tunnel Junction Elements," 2000 IEEE International Solid State Circuits Conference, ISSCC2000/Session 7/TD: Emerging Memory & Device Technologies, Feb. 8, 2000, pp. 130-131.

Greene, Jonathan, et al., "Antifuse Field Programmable Gate Arrays," Proceedings of the IEEE, vol. 81, No. 7, New York, Jul. 1993, pp. 1042-1056.

Takeuchi, Ken, et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May, 1999 pp. 675-684.

Nishihara, Toshiyuki, et al., "A Quasi-Matrix Ferroelectric Memory for Future Silicon Storage," IEEE Journal of Solid-State Circuits, vol. 37, No. 11, Nov., 2002, pp. 1479-1484.

Sugibayashi, Tadahiko, et al., "A 30-ns 256-Mb DRAM with a Multidivided Array Structure," IEEE Journal of Solid-State Circuits, vol. 28, No. 11, Nov., 1993, pp. 1092-1098.

Evans, Robert J., et al., "Energy Consumption Modeling and Optimization for SRAM's," IEEE Journal of Solid-State Circuits, vol. 30, No. 5, May, 1995, pp. 571-579.

* cited by examiner

WORD LINE ARRANGEMENT HAVING SEGMENTED WORD LINES

CROSS-REFERENCE TO RELATED APPLICATION(S)

This application is a divisional application of U.S. application Ser. No. 10/403,844 by Roy E. Scheuerlein, entitled "Word Line Arrangement Having Multi-Layer Word Line Segments For Three-Dimensional Memory Array", filed on Mar. 31, 2003 now U.S. Pat. No. 6,879,505, which application is hereby incorporated by reference in its entirety.

FIELD OF THE INVENTION

The present invention relates to semiconductor integrated circuits containing memory arrays, and in preferred embodiments the invention particularly relates to monolithic three-dimensional memory arrays.

BACKGROUND

Recent developments in semiconductor processing technologies and memory cell technologies have continued to increase the density achieved in integrated circuit memory arrays. For example, certain passive element memory cell arrays, such as those including an antifuse cell, may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory Array."

A three-dimensional (3D) memory array is most efficient when the number of cell on each bit line and word line is large. This number of cells is frequently called the fan-out (N) of the bit line and the word line. A large fan-out reduces the number of vertical connections between the array lines on each memory layer and the circuitry below. These vertical connections cannot lie beneath the individual memory cells on each layer, and thus may add significantly to the chip area. But a large fan-out frequently has certain electrical disadvantages depending on the memory cell technology being used. For example, the capacitance of array lines and the resistance of array lines may increase by the fan-out (N) factor, and leakage per cell may cause power dissipation to increase by a factor of $N^2$.

Another deleterious effect proportional to $N^2$ is the reverse bias stress on unselected cells in a passive element memory array. In particular, unselected antifuse (AF) memory cells frequently have a large reverse bias during write conditions which can degrade the reliability of unprogrammed cells if the voltage stress is maintained for a long period of time. The stress time on each cell is dependent upon the length of time that is necessary to write all the cells within a common group. For a two-dimensional (2D) array (i.e., having only a single memory plane) which is square, the common group of cells may be as large in number as the fan-out of the word line (N) times the fan-out of the bit line, or $N^2$. For an integrated three-dimensional array of passive element memory cells that is fully mirrored, as many as three memory planes may be simultaneously biased in a group, so the stress time for an individual memory cell can be proportional to $3N^2$.

Reducing the fan-out breaks the array into many smaller sub-arrays or memory blocks and is less efficient in terms of support circuitry area versus memory cell area. As a result, 3D memory arrays must make a fan-out trade-off between electrical requirements and layout efficiency that is particularly detrimental in 3D passive element memory arrays.

Many two-dimensional memory arrays segment the memory array lines and connect the segments to longer lines. Examples include Flash EEPROM devices, which segment the bit lines, DRAMs (dynamic RAMs) which segment the word line and sometimes the bit line, and SRAMs (static RAMs) which segment the word line. Such devices have the segment switches on one layer (e.g., within the silicon substrate), and have a different layer of memory cells with segmented lines, and one layer of long lines (e.g., global lines). In FIG. 1, such a traditional segmented word line arrangement 100 is shown. A row decoder 102 generates a plurality of global word lines, such as global word line 103, which traverse across all or a portion of a memory array or sub-array. A segment select block 104 (which may be part of a column decoder circuit) generates a pair of segment select lines 105, 108 for coupling a selected one of segments 107, 110 through a respective device 106, 109 to the global word line 103. The global word lines, which run parallel to the word line segments, serve as bias lines to which a select word line segment is coupled.

Despite such progress, improved memory arrays having reduced leakage and stress time are desirable, particularly memory array configurations easily fashioned into a high density three-dimensional memory array.

SUMMARY

The present invention provides, in certain embodiments, a three-dimensional high-density passive element memory cell array with short word lines while still maintaining a small support circuit area for efficiency. The word lines are preferably formed of short, low resistance word line segments on two or more word line layers which are connected together in parallel to form a given word line. No segment switch devices are employed between the word line segments. A shared vertical connection preferably connects the word line segments together and further connects the word line to a word line driver circuit disposed generally below the word line. In certain embodiments the word line driver circuit couples an associated word line to either a selected bias line or an unselected bias line associated with the driver circuit.

An array with a lower fan-out in one direction reduces the total stress time on unselected cells. If the fan-out for the word line is n, and which is a much smaller number than the fan out of the bit line (N), the stress time on unselected cells is proportional to n times N. Thus, the stress time is greatly reduced by decreasing the fan-out of just the word line.

In the case of AF memory cells the stress time is long because an individual cell must be stressed in a forward bias condition for hundreds of nanoseconds (ns) to produce the breakdown that initiates the programming event. Traditionally, AF memory arrays program only one bit at a time in the group so that the energy needed to program the AF is dedicated to one selected memory cell (e.g., one bit). As that one cell breaks down, high currents flow in the long bit lines and word lines. A second cell on either the bit line or the word line would typically be robbed of the needed energy to program successfully. However, if the word line is very short and driven by low resistance drivers, the energy of a first programmed cell on the word line would have little effect on other programmed cells on the word line. Since each simultaneously programmed cell on the word line resides on a different bit line (to preserve the respective logic value for each bit), the current along any bit line is no higher than for programming a single memory cell. Consequently, interference due to currents in the array lines is avoided by reducing the word line fan-out, without requiring a reduction in the bit line fan-out. This allows the simultaneous programming of multiple bits on one word line, and directly reduces the stress time endured by the unselected cells in the group. By programming more than one memory cell of the group at a time, and with the reduction in the size of the group itself to n times N, the stress time of unselected bits is greatly reduced. In addition, the programming of multiple bits at a time on one word line has the additional benefit of increasing write bandwidth.

Other types of passive element arrays such as organic passive elements also benefit from the reduced stress time on cells and the higher bandwidth operations possible when the fan-out of the word line is reduced.

In a three-dimensional memory array, it is preferable to select cells for programming on multiple layers, and more preferably on each of the layers, to reduce stress time. This is particularly valuable for mirrored 3D structures in which selecting a cell on a single memory layer produces stress to unselected cells on multiple layers. In a half-mirrored array (e.g., having a word line layer shared exclusively by two bit line layers), memory cells may be selected on two memory layers without producing stress on additional memory layers. Although selecting a cell on a layer stresses that layer, no additional layers are stressed (e.g., only one layer stressed per selected memory cell).

The passive element memory array (PEMA) may incorporate write-once memory cells or memory cells that have a less extreme change in conductivity, and may be fuse-type cells or anti-fuse type cells. The memory cells preferably include antifuse memory cells, and the memory array preferably is a half-mirrored memory array having respective word line layers shared by two respective bit line layers that are not shared with other word line layers. In other words, each memory plane preferably includes a unique bit line layer but a shared word line layer.

In some embodiments, the present invention provides a three-dimensional electrically programmable read-only memory (EPROM) array having word lines formed by multiple layers of word line segments which are connected by a shared vertical connection to an associated word line driver circuit. In certain exemplary embodiments, such memory arrays may be realized with array blocks having a very large number of word lines and a relatively small number of bit lines. For example, an exemplary array block may include around 8000 word lines on a word line layer, but only about 100 bit lines on a bit line layer. As a result, the length of each word line segment forming the word lines is kept very short, while the length of the bit lines is considerably larger.

The invention in several aspects is suitable for integrated circuits having a memory array, for memory cell and memory array structures, for methods for operating such integrated circuits and memory arrays, for methods for forming or fabricating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
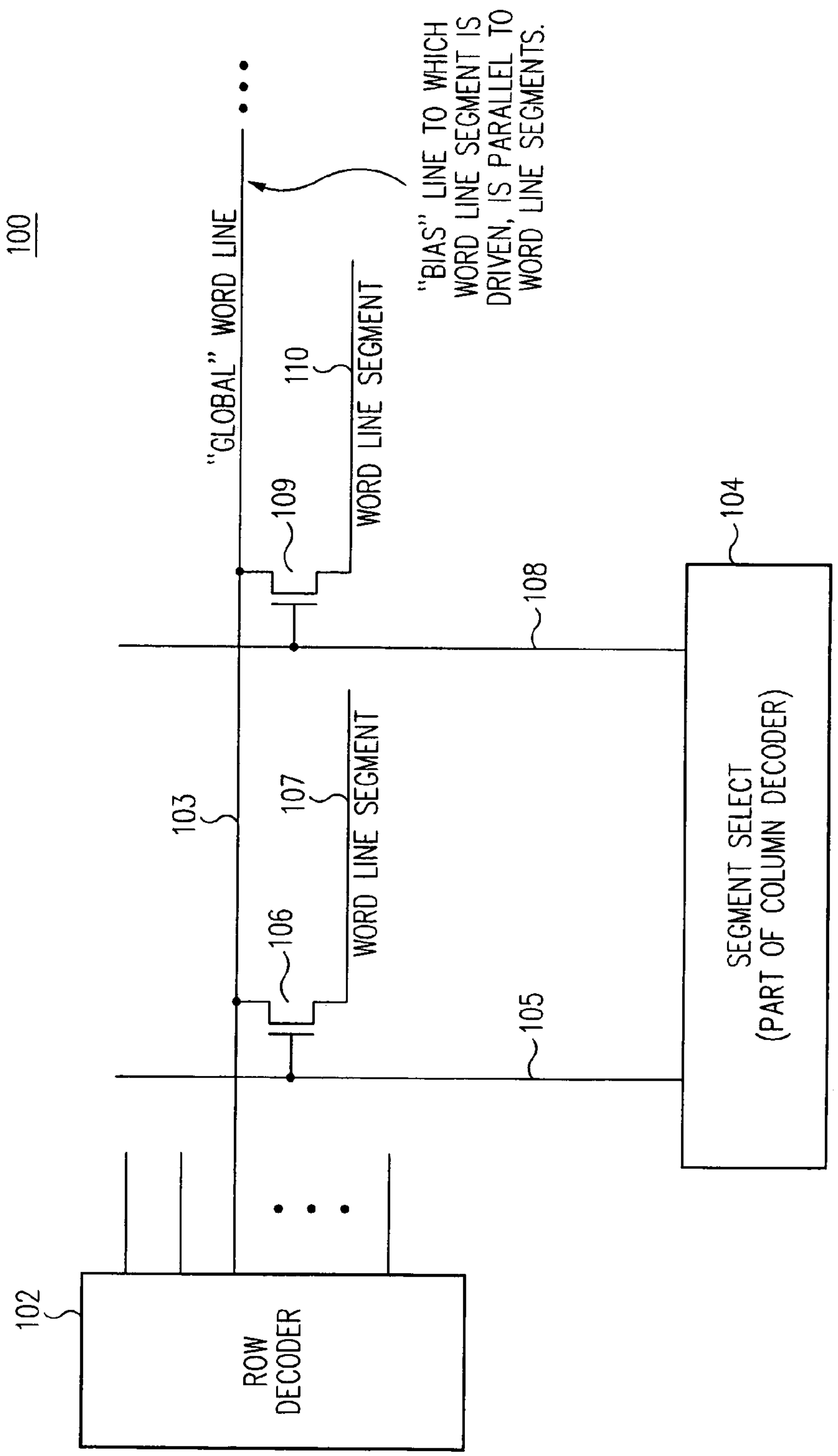
FIG. 1 is a schematic diagram of a traditional segmented word line arrangement.
Figure 2:
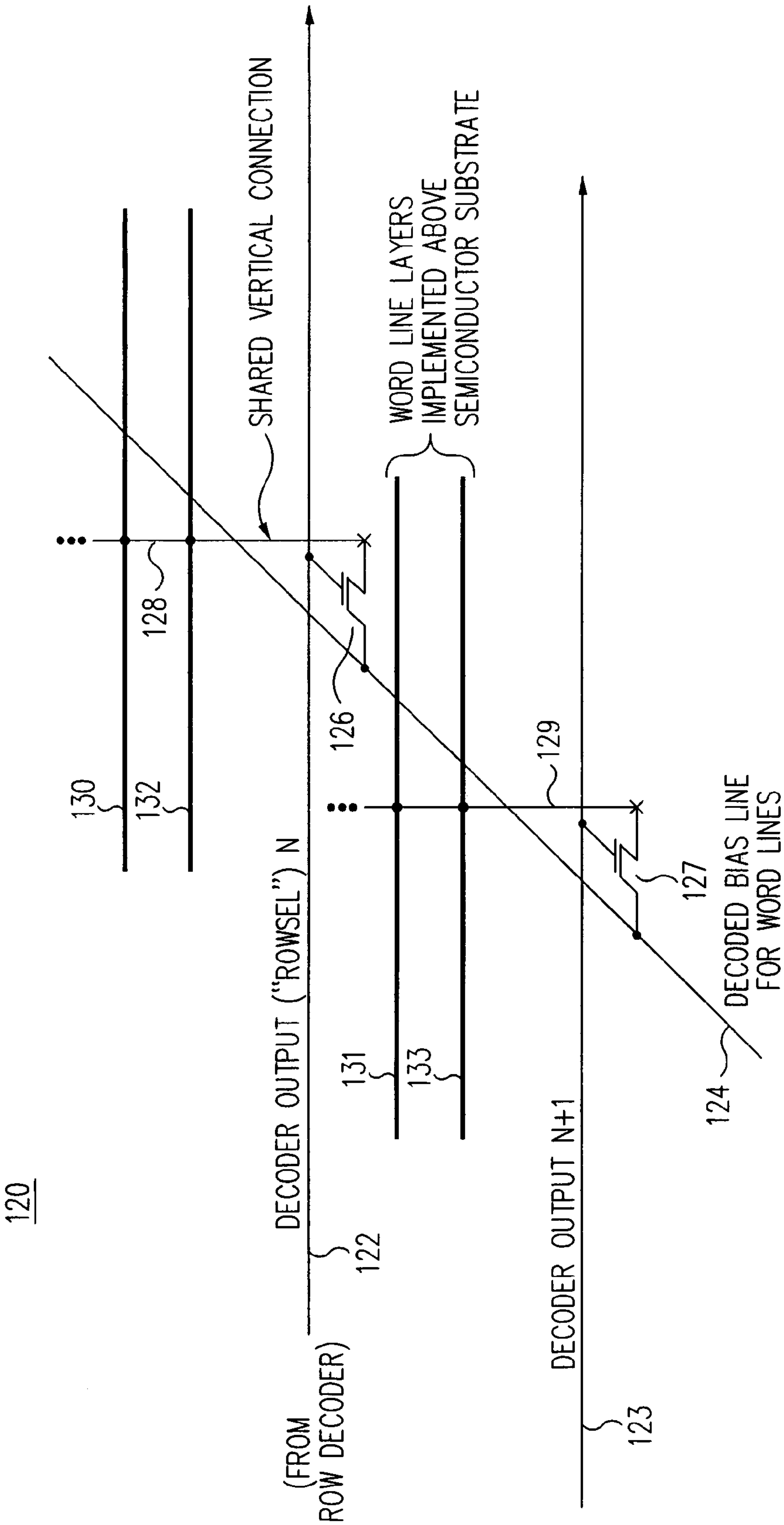
FIG. 2 is a schematic diagram representing a three-dimensional memory array having a segmented word line arrangement in accordance with certain embodiments of the present invention.

Referring now to FIG. 2, a schematic diagram is shown representing a three-dimensional memory array having a segmented word line arrangement in accordance with certain embodiments of the present invention. Each word line is formed by one or more word line segments on at least one, and advantageously more than one, word line layer of the memory array. For example, a first word line is formed by word line segment 130 disposed on one word line layer of the memory array and by word line segment 132 disposed on another word line layer. The word line segments 130, 132 are connected by a vertical connection 128 to form the first word line. The vertical connection 128 also provides a connection path to a driver device 126 disposed in another layer (e.g., within the semiconductor substrate). A decoded output 122 from a row decoder (not shown) traverses substantially parallel to the word line segments 130, 132 and when selected, couples the word line segments 130, 132 through device 126 to a decoded bias line 124 which traverses substantially perpendicular to the word line segments.

Also shown are word line segments 131, 133 which are connected by a vertical connection 129 to form a second word line and to provide a connection path to driver device 127. Another decoded output 123 from the row decoder couples, when selected, these word line segments 131, 133 through device 127 to the decoded bias line 124. While this figure conceptually introduces the invention, many embodiments are described herebelow which include variations to the configuration shown, and moreover include details which may be appropriate for certain embodiments but not necessarily for all embodiments.

Figure 3:
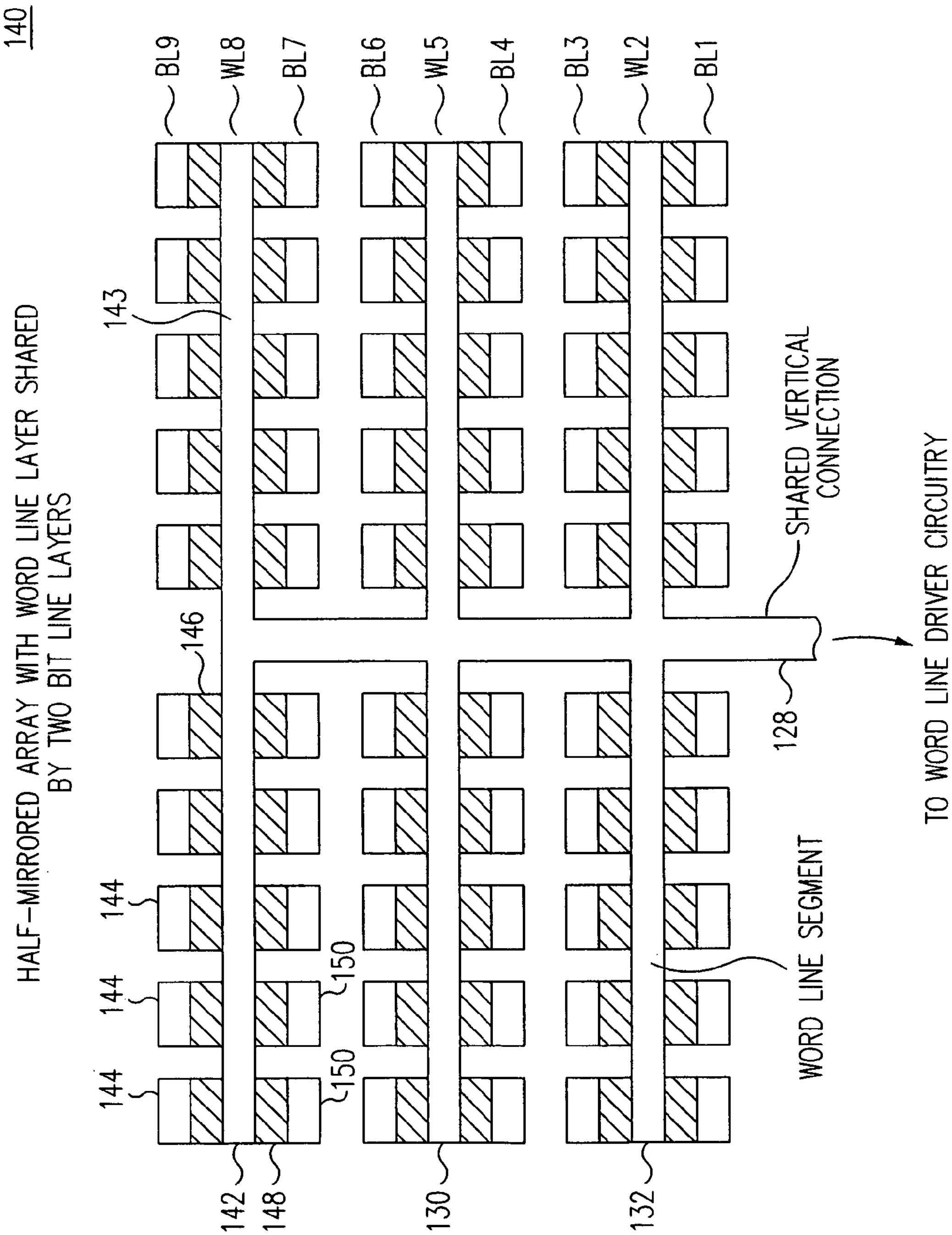
FIG. 3 is a cross-section view of a three-dimensional memory array having a segmented word line arrangement in accordance with certain embodiments of the present invention, which shows a half-mirrored memory array having word line layers shared by two bit line layers.

FIG. 3 is a cross-section view of a three-dimensional half-mirrored memory array having word line layers each respectively shared by two bit line layers. Three word line layers are depicted, labeled WL2, WL5, and WL8. The word line segments on layer WL8 are shared by bit lines on bit line layers BL7 and BL9. Similarly, the word line layer WL5 is shared by bit line layers BL4 and BL6, and the word line layer WL2 is shared by bit line layers BL1 and BL3.

Word line segments 132, 130, and 142 are connected by vertical connection 128 to form a word line. A plurality of bit lines 144 is shown on bit line layer BL9. A plurality of memory cells 146 is formed between each bit line 144 and the word line segment 142. Similarly, a plurality of memory cells 148 is formed between each bit line 150 (on layer BL7) and the word line segment 142. Other word line layers are similarly arranged, as shown.

Figure 4:
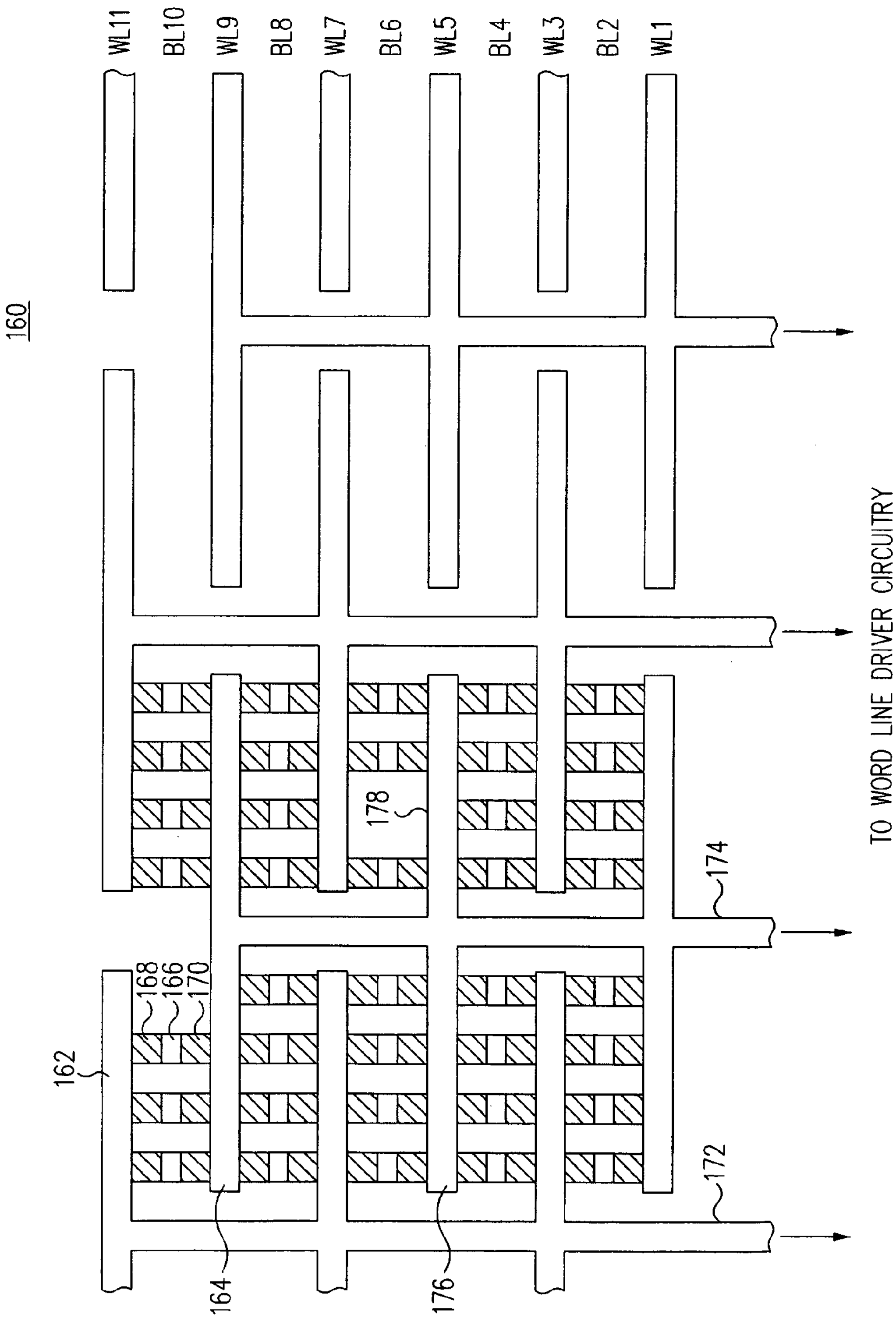
FIG. 4 is a cross-section view representing a three-dimensional memory array having a segmented word line arrangement in accordance with certain embodiments of the present invention, which shows two groups of word line layers, and which in this exemplary configuration shows a fully-mirrored memory array having bit line layers shared by two word line layers.

FIG. 4 is a cross-section view representing a three-dimensional fully-mirrored memory array having a segmented word line arrangement in accordance with certain embodiments of the present invention, which shows two groups of word line layers. One or more word line segments on each of layers WL1, WL5, and WL9 are connected (e.g., by vertical connection 174) to form a word line, while one or more word line segments on each of layers WL3, WL7, and WL11 are connected (e.g., by vertical connection 172) to form a word line. A plurality of bit lines 166 is shown on bit line layer BL10. A plurality of memory cells 168 is respectively formed between each bit line 166 and the word line segment 162 (on layer WL11). Similarly, a plurality of memory cells 170 is respectively formed between each bit line 166 and the word line segment 164 (on layer WL9). Other word line layers are similarly arranged, as shown, providing a total of ten memory planes for this exemplary structure. If an additional bit line layer were provided below the WL1 layer, and an additional bit line layer were provided above the WL11 layer, then a total of twelve memory planes would be provided.

Selectivity of the memory array is accomplished by selecting one word line associated with a bit line layer but not the other. For example, driver circuitry may drive vertical connection 172 and its connected word line segments to an active level while keeping vertical connection 174 and its connected word line segments at an inactive level, to select one or more memory cells 168 (depending upon how many bit lines are selected) while keeping memory cells 170 unselected (or at least "half-selected" for those sharing a selected bit line 166). Each vertical connection in the figure is shared by two word line segments on an associated word line layer. For example, word line segments 176 and 178 share the vertical connection 174. Other configurations of word line segments and associated vertical connections are described in greater detail below.

The word line arrangement shown in FIG. 4 may also be utilized with half-mirrored memory arrays having word line layers shared by two bit line layers, similarly to that shown in FIG. 3. In such an example having six word line layers as depicted, the memory array would include up to twelve memory planes since each word line layer would be associated with two memory planes.

Figure 5:
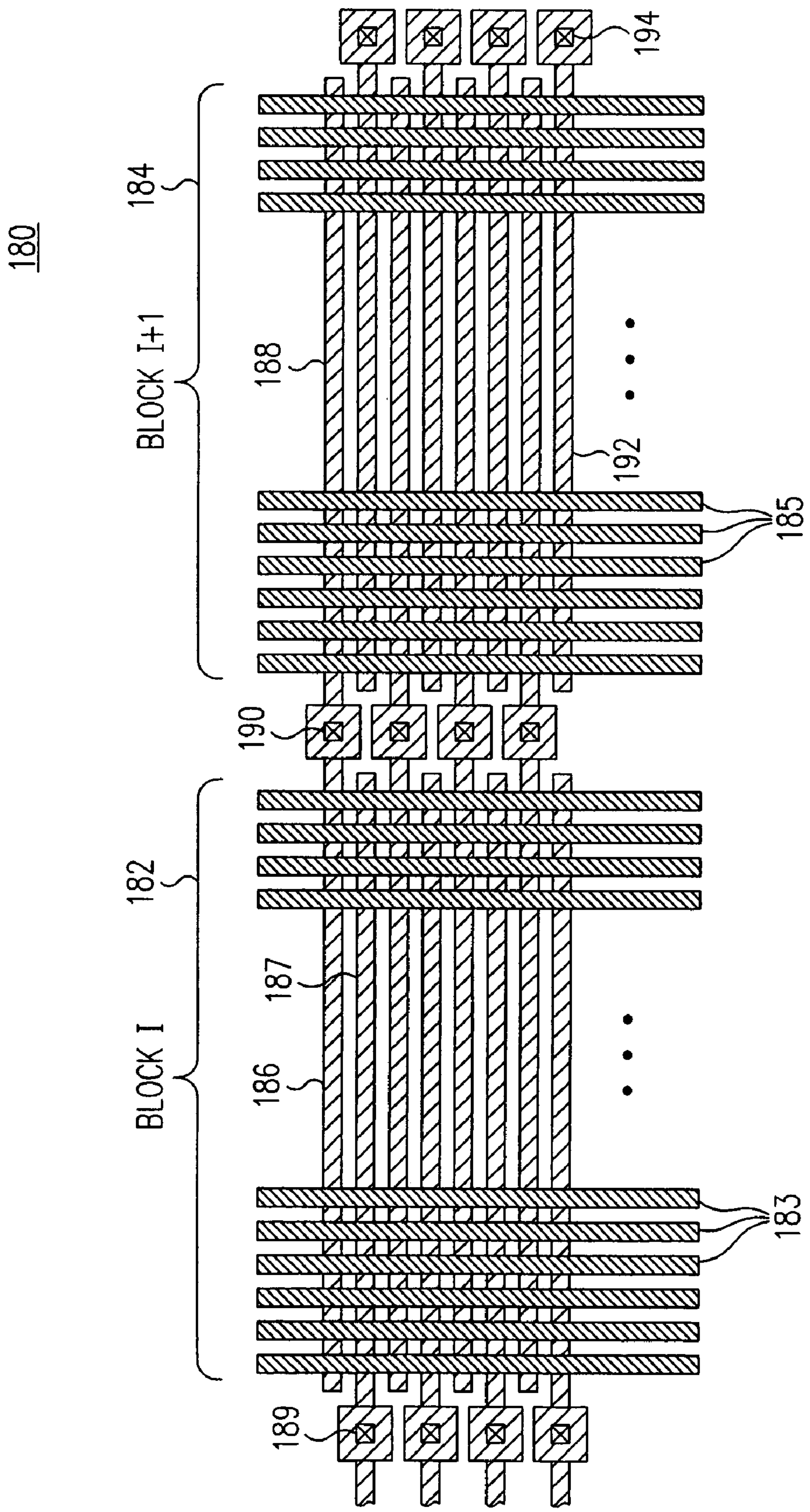
FIG. 5 is a top view representing a word line layer and a bit line layer of a three-dimensional memory array in accordance with certain embodiments of the present invention, which shows 2:1 interleaved word line segments, where vertical connections to half of the word line segments for a block are on the left side of the block, and vertical connections to the other half of the word line segments for the block are on the right side of the block. In addition, a word line segment from two adjacent blocks shares each vertical connection.

FIG. 5 is a top view representing a word line layer and a bit line layer of a three-dimensional memory array in accordance with certain embodiments of the present invention. As suggested above, other word line layers and bit line layers may be implemented identically with those shown and thus would share the same vertical connections. Memory blocks 182, 184 are shown respectively including a plurality of bit lines 183, 185, and having 2:1 interleaved word line segments. Vertical connections to half of the word line segments for a block are on the left side of the block (e.g., word line segment 187 and vertical connection 189), and vertical connections to the other half of the word line segments for the block are on the right side of the block (e.g., word line segment 186 and vertical connection 190). In addition, each vertical connection serves a word line segment in each of two adjacent blocks. For example, vertical connection 190 connects to word line segment 186 in array block 182 and connects to word line segment 188 in array block 184. In other words, each vertical connection (such as vertical connection 190) is shared by a word line segment in each of two adjacent blocks. As would be expected, however, the respective "outside" vertical connections for the first and last array blocks may serve only word line segments in the first and last array blocks. For example, if block 184 is the last block of a plurality of blocks forming a memory array, its outside vertical connections (e.g., vertical connection 194) may serve only the word line segment 192 within block 184, and are thus not shared by two word line segments as throughout the remainder of the array.

By interleaving the word line segments as shown, the pitch of the vertical connections is twice the pitch of the individual word line segments themselves. This is particularly advantageous since the word line pitch which is achievable for many passive element memory cell arrays is significantly smaller than achievable for many via structures which might be employed to form the vertical connections. Moreover, as described in greater detail below, this also may reduce the complexity of the word line driver circuitry to be implemented in the semiconductor substrate below the memory array.

Figure 6:
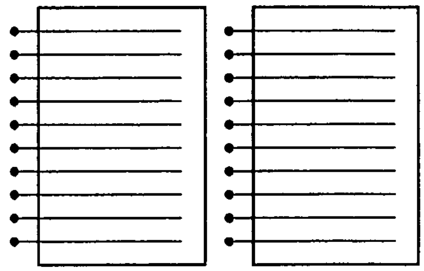
FIG. 6 is a top view representing a word line layer and associated vertical connections, in accordance with certain embodiments of the present invention, which shows non-interleaved word line segments, where vertical connections to the word line segments for a block are on one side of the block. The vertical connections are not shared by more than one block.

Other configurations are also contemplated for the word line segments and the vertical connections. For example, FIG. 6 is a top view representing a word line layer and associated vertical connections, which shows non-interleaved word line segments, where vertical connections to the word line segments for a block are on one side of the block. The vertical connections could all be on the same side of its associated block (as shown here on the left side of each block), or could be alternated such that a double column of vertical connections occurs between every other array block. The vertical connections are not shared by more than one block.

Figure 7:
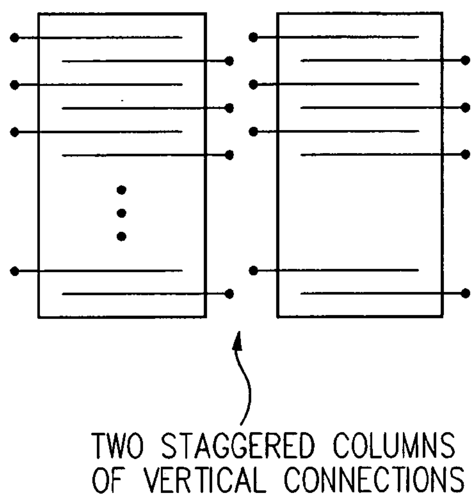
FIG. 7 is a top view representing a word line layer and associated vertical connections, in accordance with certain embodiments of the present invention, which shows 2:1 interleaved word line segments, where vertical connections to half of the word line segments for a block are on the left side of the block, and vertical connections to the other half of the word line segments for the block are on the right side of the block. The vertical connections are not shared by more than one block.

FIG. 7 is a top view representing a word line layer and associated vertical connections, which shows 2:1 interleaved word line segments, where vertical connections to half of the word line segments for a block are on the left side of the block, and vertical connections to the other half of the word line segments for the block are on the right side of the block. The vertical connections are not shared by more than one block. The vertical connections between each block may be arranged in a single column, which reduces the lateral spacing between adjacent blocks but which requires a vertical connection pitch equal to the word line pitch, or may be staggered as shown to relax the required spacing between vertical connections at a small expense in block-to-block spacing.

Figure 8:
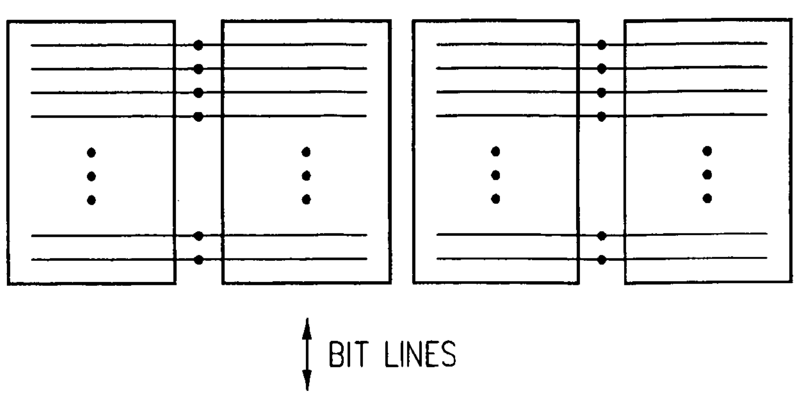
FIG. 8 is a top view representing a word line layer and associated vertical connections, in accordance with certain embodiments of the present invention, which shows non-interleaved word line segments, where vertical connections to the word line segments for a block are on one side of the block, and where a word line segment from two adjacent blocks shares each vertical connection.

FIG. 8 is a top view representing a word line layer and associated vertical connections, which shows non-interleaved word line segments, where vertical connections to the word line segments for a block are on one side (but not both sides) of the block, and where a word line segment from two adjacent blocks shares each vertical connection.

Figure 9:
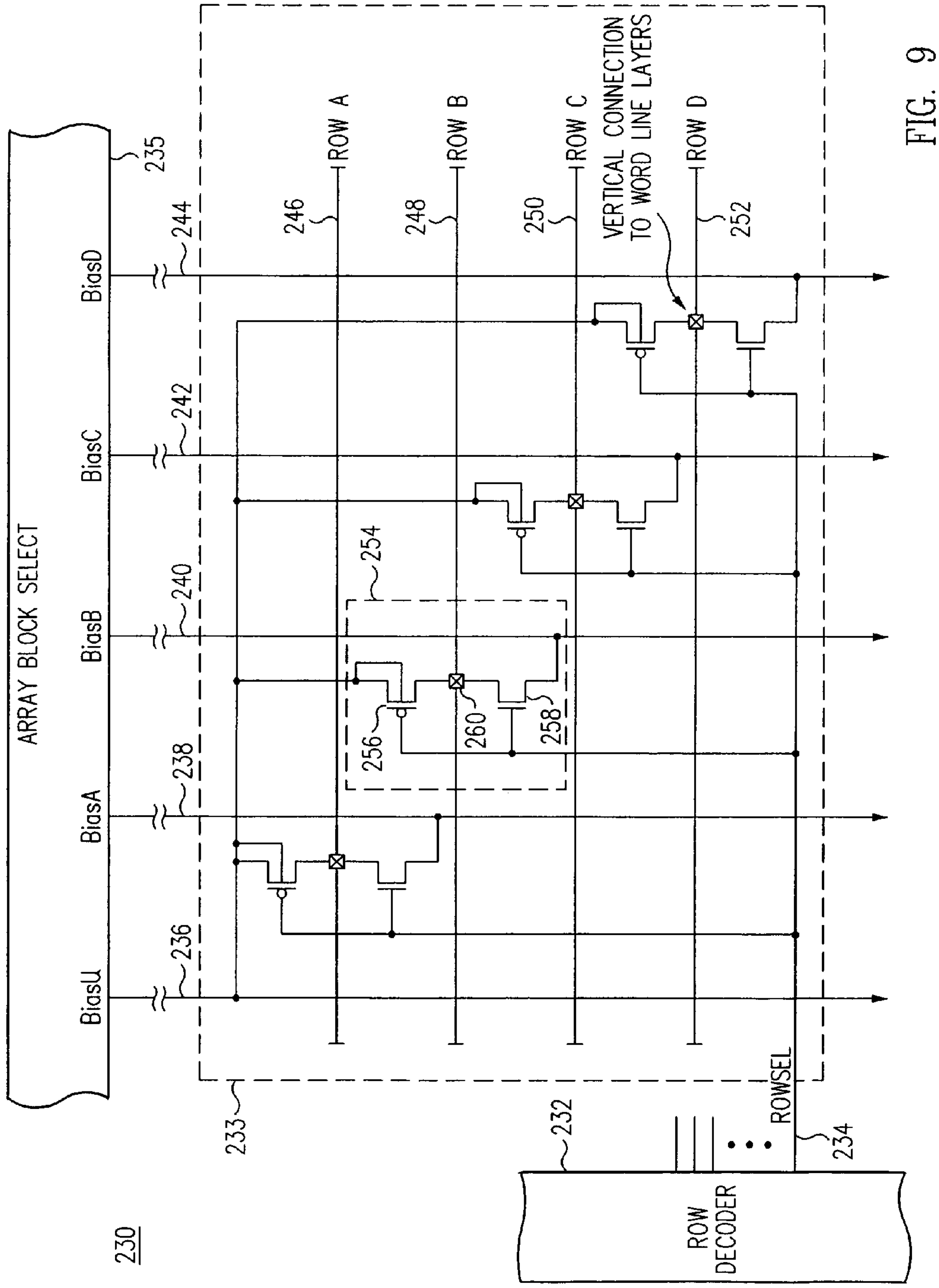
FIG. 9 is a schematic diagram representing a multi-headed word line decoder having bias lines traversing perpendicular to the word line segments and having a row select line traversing parallel to the word line segments.

FIG. 9 is a schematic diagram representing a multi-headed word line decoder configuration 230 having bias lines traversing perpendicular to the word line segments and having decoded row select lines (sometimes referred to herein as a "select node") traversing parallel to the word line segments. A row decoder 232 generates a plurality of decoded row select lines, one of which is labeled 234. An array block select circuit 235 generates an unselected bias level BiasU on node 236, and generates four decoded bias levels BiasA, BiasB, BiasC, and BiasD respectively on nodes 238, 240, 242, and 244. A quad word line driver circuit 233 includes four separate word line driver circuits 254, each for driving a respective word line to the unselected bias line BiasU (when the row select 234 is unselected) or to a respective one of the four "selected" bias lines BiasA, BiasB, BiasC, and BiasD (when the row select 234 is selected).

Referring to the individual word line driver circuit labeled 254, a first transistor 256 drives the word line 248 (by way of the vertical connection 260) to the unselected bias level BiasU when the row select 234 is low, as would be the case for all the unselected row select lines generated by the row decoder 232. A second transistor 258 drives the word line 248 (also labeled ROW B, which typically includes one or more word line segments on each of more than one word line layer) to the associated bias level BiasB when the row select 234 is high, as would be the case for the one "selected" row select line generated by the row decoder 232. Generalizing to all four word lines, when the row select 234 is high, each of the word lines 246, 248, 250, and 252 is respectively driven to its associated bias line BiasA, BiasB, BiasC, and BiasD. One of the bias lines BiasA, BiasB, BiasC, and BiasD is driven to a selected level, while the remaining three of the bias lines are maintained at an unselect bias level, such as the BiasU level. Consequently, one of the four word lines 246, 248, 250, and 252 is respectively driven to the selected bias level while the remaining three word lines remain at the unselected bias level.

In the exemplary configuration shown, the row select 234 is selected when it is high, and unselected when it is low, and the unselected bias level BiasU is higher than the selected one of the four bias levels BiasA, BiasB, BiasC, and BiasD. Consequently the transistor 256 is advantageously implemented as P-channel device and the transistor 258 as an N-channel device. Exemplary voltages for memory array incorporating antifuse memory cells are a selected bias level of 0 volts and an unselected bias level BiasU of nominally 8 volts. In other embodiments the polarity of the voltages, and the polarity of the driver transistors 256, 258 may be reversed. Moreover, other driver devices may be utilized, such as two N-channel transistors, depending on the particular memory cell technology and the desired unselected and selected word line voltages. While four such decoded selected bias lines are described above, in other embodiments two such lines may be provided, with each row select node consequently being coupled to two word line driver circuits within each group of drivers, or even just one selected bias line provided in other embodiments.

Figure 10:
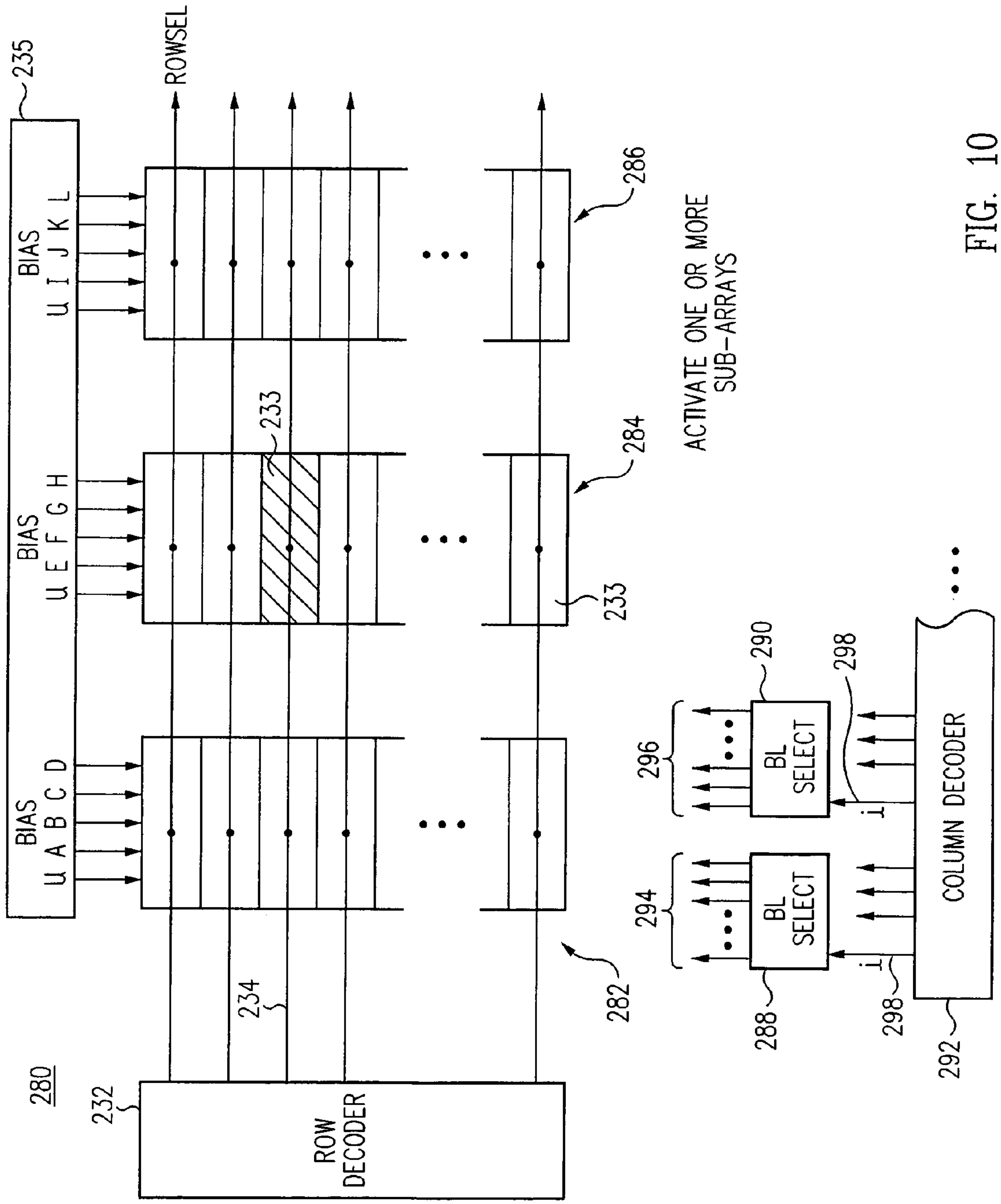
FIG. 10 is a schematic diagram representing a multi-headed word line decoder having multiple four-headed driver circuits, such as that depicted in FIG. 9, spaced across at least a portion of the memory array.

FIG. 10 is a schematic diagram representing a multi-headed word line decoder having multiple four-headed driver circuits, such as that depicted in FIG. 9, spaced across at least a portion of the memory array. The row decoder 232 generates a plurality of decoded row select lines, one of which is labeled 234, as before. An array block select circuit 235 generates an unselected bias level BiasU, and generates four decoded bias levels BiasA, BiasB, BiasC, and BiasD, here labeled as U, A, B, C, and D. Each of a vertical group 282 of quad word line driver circuits 233 is responsive to a respective one of the row select lines generated by the row decoder 232. All of the quad word line driver circuits 233 within the group 282 are associated with the U, A, B, C, and D bias lines, as suggested by the configuration shown in FIG. 9.

In this embodiment, however, the array block select circuit 235 also generates another respective set of bias lines for each of two additional groups 284, 286 of quad word line driver circuits 233. The second set of bias lines includes an unselected bias level BiasU, and generates four decoded bias levels BiasE, BiasF, BiasG, and BiasH, here labeled as U, E, F, G, and H. The third set of bias lines includes an unselected bias level BiasU, and generates four decoded bias levels BiasI, BiasJ, BiasK, and BiasL, here labeled as U, I, J, K, and L. Referring again at the row select 234, one quad word line driver circuit 233 in each of the groups 282, 284, and 286 is responsive to the row select 234 signal, and the array block select circuit 235 may be implemented to decode the bias lines A, B, C, . . . , K, L so that only one such bias line is selected (i.e., driven to the selected bias level). As a result, only one word line associated with row select 234 is selected, and the remaining eleven word lines that are associated with row select 234 remain unselected.

Each word line driver 254 may be assumed for this embodiment to be coupled to a word line segment in each of two adjacent array blocks (e.g., an array such as that shown in FIG. 5). Consequently, two bit line select circuits 288, 290 are associated with the group 282 of word line driver circuits, one for each of the two adjacent array blocks having word lines driven by the group 282. Each bit line select circuit 288, 290 may be configured to simultaneously select one or more bit lines 294, 296 during the same memory operation (e.g., read or programming operation). Consequently, each is respectively driven with a column decoder output signal 298, 299 from a column decoder 292 that is active whenever the selected word line is associated with the group 282. The column decoder and column select circuitry may take on a variety of implementations, but is preferably implemented as described in "Tree Decoder Structure Particularly Well Suited to Interfacing Array Lines Having Extremely Small Layout Pitch," U.S. patent application Ser. No. 10/306,888, filed Nov. 27, 2002, which application is hereby incorporated by reference in its entirety.

Since each array block is assumed (for this embodiment) to have half of its word lines driven from one side and the other half of its word lines driven from the other side, the right-most array block associated with the group 282 may also be associated with group 284, and the bit line select circuit 290 may also be activated when the selected word line is associated with the group 284. In such a configuration, two adjacent bit line select circuits may be enabled during any single cycle. In other configurations, especially those not sharing vertical connections between adjacent array blocks, only one such bit line select circuit may be enabled during a memory operation. Other examples are further described herebelow.

Figure 11:
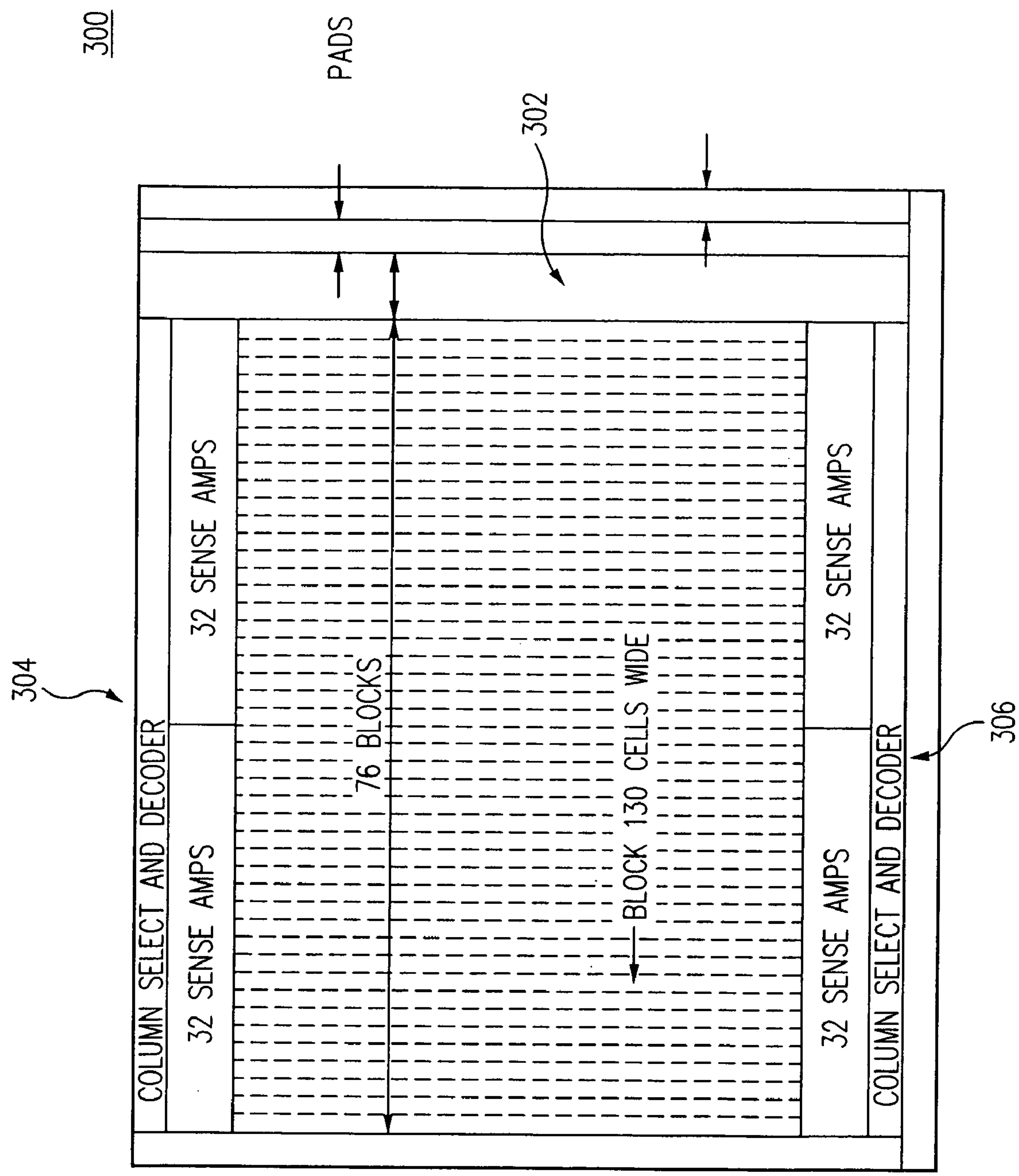
FIG. 11 is a block diagram of an exemplary memory array and associated support circuitry, in accordance with certain embodiments of the present invention, having a single multi-headed row decoder supporting 76 memory array blocks of 130 cells each, and having interleaved bit lines, half of which are supported by column decoder and sense/programming circuitry at the top of the array, and the other half of which are supported by column decoder and sense/programming circuitry at the bottom of the array.

The multi-headed row decoder configuration having segmented word lines vertically connected to their respective word line driver circuits, as described above, may be extended to a very large number of heads per row decoder row select output signal. Referring now to FIG. 11, a block diagram is shown of an exemplary memory array 300 and associated support circuitry having a single multi-headed row decoder supporting 76 memory array blocks, each 130 cells wide (i.e., 130 bit lines per block per bit line layer). The row decoder is thus a 304-headed decoder 302 placed to one side of the array, with the word line driver circuits (i.e., the decoder "head circuits") distributed across the array generally beneath their associated memory array block.

The array 300 includes interleaved bit lines, half of which are supported by column decoder and sense/programming circuitry 304 at the top of the array, and the other half of which are supported by column decoder and sense/programming circuitry 306 at the bottom of the array.

Each array block includes 8×130×8448=8,785,920 memory cells, which results from eight memory planes, 130 bit lines, and 8448 word lines forming each block. Because there is only one row decoder, the row select lines generated by the row decoder traverse all the way across the memory array. The array is a half-mirrored array having a word line layer shared by two associated bit line layers to form two vertically adjacent memory planes. Four word line layers and eight bit line layers thus collectively form the eight memory planes.

As with many of the embodiments described herein, the word lines are connected to the cathode end of the memory cell (i.e., the n-type side of the diode). Assuming a bit line resistance of 0.5 ohms/square, the long bit lines have an end-to-end resistance of 9 Kohms. Assuming a word line resistance of 0.5 ohms/square, the short word line segments have an end-to-end resistance of only 125 ohms, giving rise to a 72:1 ratio between the bit line and word line end-to-end resistance.

The word line segments in a block are interleaved, with half sharing a vertical connection on the right side of the block with word line segments in the adjacent block, and the other half sharing a vertical connection with word line segments to the left of the block. Each vertical connection may be formed by a 0.21×0.21$\mu$ "zia" on a pitch of 0.6$\mu$ and having a nominal resistance of 100 ohms.

Figure 12:
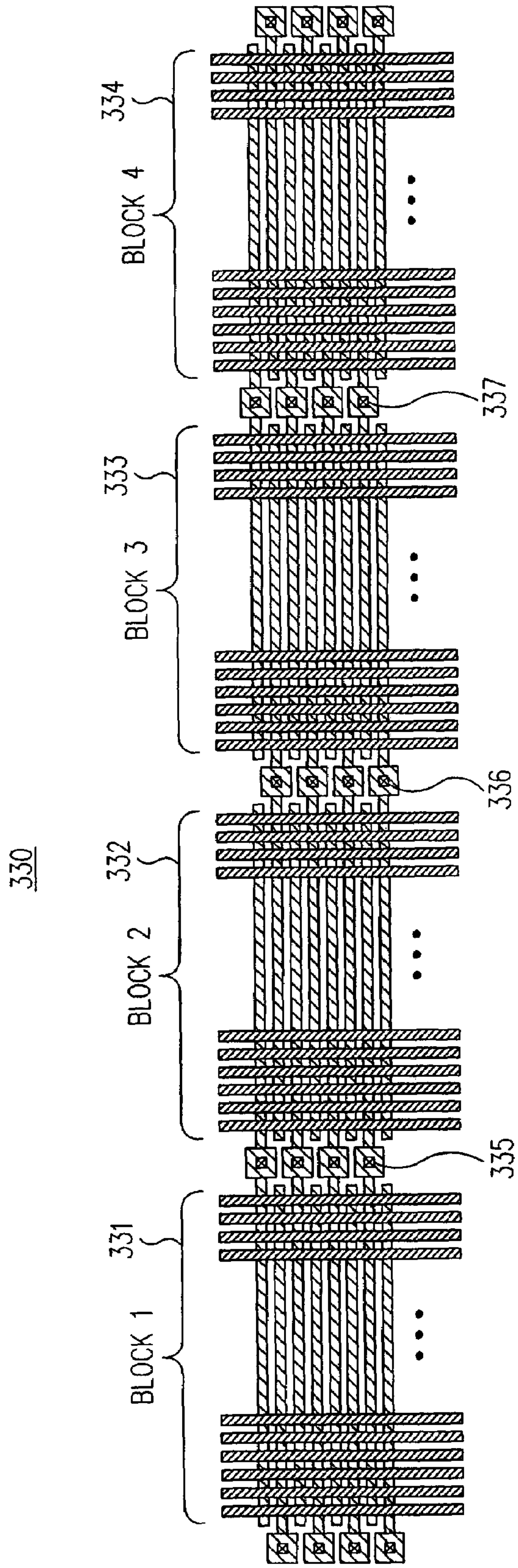
FIG. 12 is a top view representing a word line layer and a bit line layer of a three-dimensional memory array, which shows four blocks having 2:1 interleaved word line segments and shared vertical connections, as in FIG. 6, and which illustrates activating a single array block for certain embodiments and activating a pair of adjacent array blocks for certain other embodiments.

FIG. 12 is a top view representing a word line layer and a bit line layer of a three-dimensional memory array configuration 330, which shows four array blocks 331, 332, 333, and 334, each having 2:1 interleaved word line segments and shared vertical connections, as earlier depicted in FIG. 6. In certain embodiments, one or more memory cells which are selected for an operation may all be found within one array block. Assume briefly that the selected memory cells are found within block 332. If the selected word line is driven by way of a vertical connection 335, then a word line segment in block 331 is also selected. Alternatively, if the selected word line is driven by way of a vertical connection 336, then a word line segment in block 333 is also selected.

In other embodiments, selected memory cells may be located within two adjacent memory array blocks. For example, if a selected word line is driven by way of the vertical connection 336, then bit lines are selected within both block 332 and block 333 to address selected memory cells within both blocks 332, 333. Alternatively, if a selected word line is driven by way of the vertical connection 337, then bit lines are selected to address selected memory cells within both block 333 and block 334. In such cases, bias circuits are enabled within both adjacent blocks to provide suitable unselected and selected bias levels for the word line drivers in the two activated array blocks.

Figure 13:
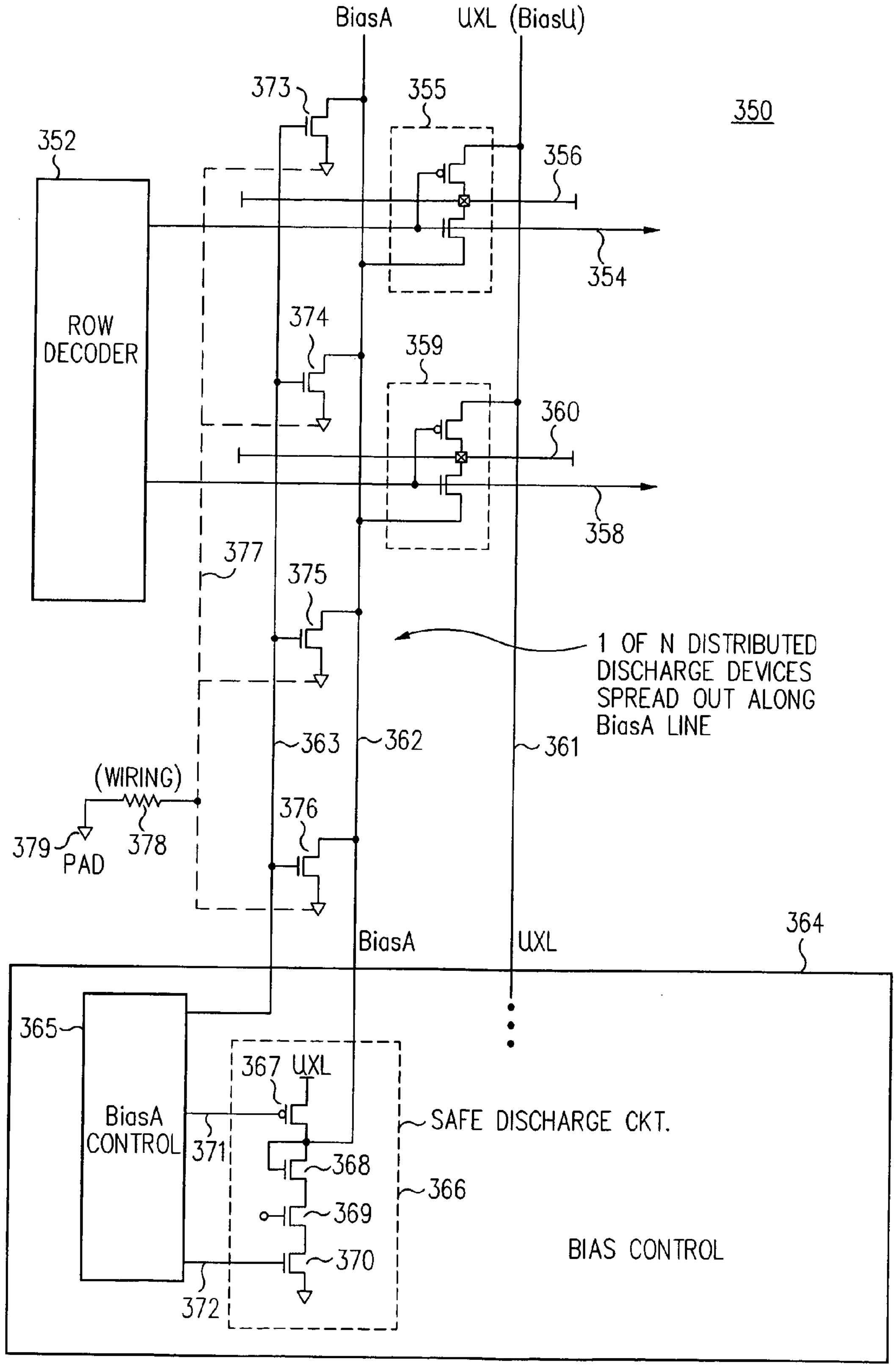
FIG. 13 is a schematic diagram representing a bias control circuit for a multi-headed word line decoder, having a first circuit for discharging the bias line from an initial high voltage to a lower voltage, and having a second circuit which is distributed along the length of the bias line for providing a low impedance connection to a ground plane.

FIG. 13 is a schematic diagram representing an exemplary arrangement 350 for generating one of the decoded bias lines. A bias control circuit 364 generates the BiasA control line 362, which in this example is driven to the UXL level when inactive, and which is driven to ground when active (i.e., selected). The bias control circuit 364 includes a safe discharge circuit 366 which is enabled to initially discharge the BiasA line 362 from the UXL voltage level at least to a voltage much closer to ground, if not virtually all the way to ground. Then, a second discharge circuit is enabled to provide a low impedance path from the BiasA line to ground.

A BiasA control circuit 365 within the bias control circuit 364 generates two control signals 371, 372 to control the safe discharge circuit 366. Transistor 367 is turned on by a low voltage on signal 371 to drive the BiasA line 362 to the unselected UXL voltage. A high level on node 372 turns on transistor 370 to discharge the BiasA line 362 through the series combination of transistors 368, 369, and 370. The cascode-connected transistor 369 limits the drain-to-source voltage across transistor 370, while the diode-connected transistor 368 reduces the drain-to-source voltage across transistor 369 so that hot electron effects do not alter the threshold voltage or the long term reliability of transistors in the discharge path. The gate of transistor 369 is biased at an intermediate voltage chosen to substantially equally divide the drain-to-source voltage between the devices in the series-connected stack.

The impedance of such a series connected group of transistors is not as low as a single transistor might be, and in particular, may not be low enough to provide a good ground level to the selected word line, especially if it is desired to program more than one memory cell during the same cycle. Consequently, in this embodiment the BiasA control circuit 365 also generates a second discharge control signal 363, which is conveyed to the control terminal of each of a plurality of second discharge circuits 373, 374, 375, and 376 which are spatially distributed along the BiasA control line 362. In this embodiment each of the second discharge circuits is a single N-channel transistor whose gate terminal is coupled to the discharge control signal 363, although other arrangements may be employed. The source terminal of each of the discharge transistors 373, 374, 375, and 376 is coupled locally to a power grid 377 traversing the array, which is then coupled to the power pad 379, as described herebelow in greater detail. The parasitic wiring resistance of the grounding path for the BiasA line, represented as parasitic resistance 378, may thus be quite small. For example, when row select node 358 is selected (e.g., in this example, at a high level), the word line 360 is coupled by the N-channel transistor of word line driver circuit 359 to the BiasA line 362, which is then coupled by a group of discharge transistor 373, 374, 375, and 376, but in particular by a nearby transistor 375, to the ground power grid 377. When row select node 354 is selected by the row decoder 352, the word line 356 is coupled by word line driver circuit 355 to the BiasA line 362, which is locally coupled by nearby transistor 374 to the ground power grid 377.

By implementing word lines which are formed of short word line segments on each of several layers, architecting the memory cell polarity so that programming current is sourced into the word lines, and implementing a distributed discharge circuit such as the exemplary circuit shown, it is easier to program multiple memory cells along the same word line during the same memory operation. Any resistive voltage drops along the word line as a result of high programming current are reduced by the short word line segments, and the driven end of the word line is brought to a voltage very near the ground pad voltage. Since each selected bit line during such a multiple-bit programming operation is driven by a separate bit line driver, the end-to-end bit line resistance may be much higher than the end-to-end word line resistance without serious negative effects, and the bit lines may be implemented to be much longer than the word lines. For example, the end-to-end bit line resistance may be 10× higher than the end-to-end word line resistance. As used here, the end-to-end word line resistance is measured on a word line segment from the vertical connection (with its driver circuit) to the far end of the word line segment. In other words, it corresponds to the longest distance that current flow may traverse within the word line. Moreover, while a portion of an exemplary memory array is shown for description purposes, but it should be understood that other bias lines (not shown) would typically be implemented in an analogous fashion.

Figure 14:
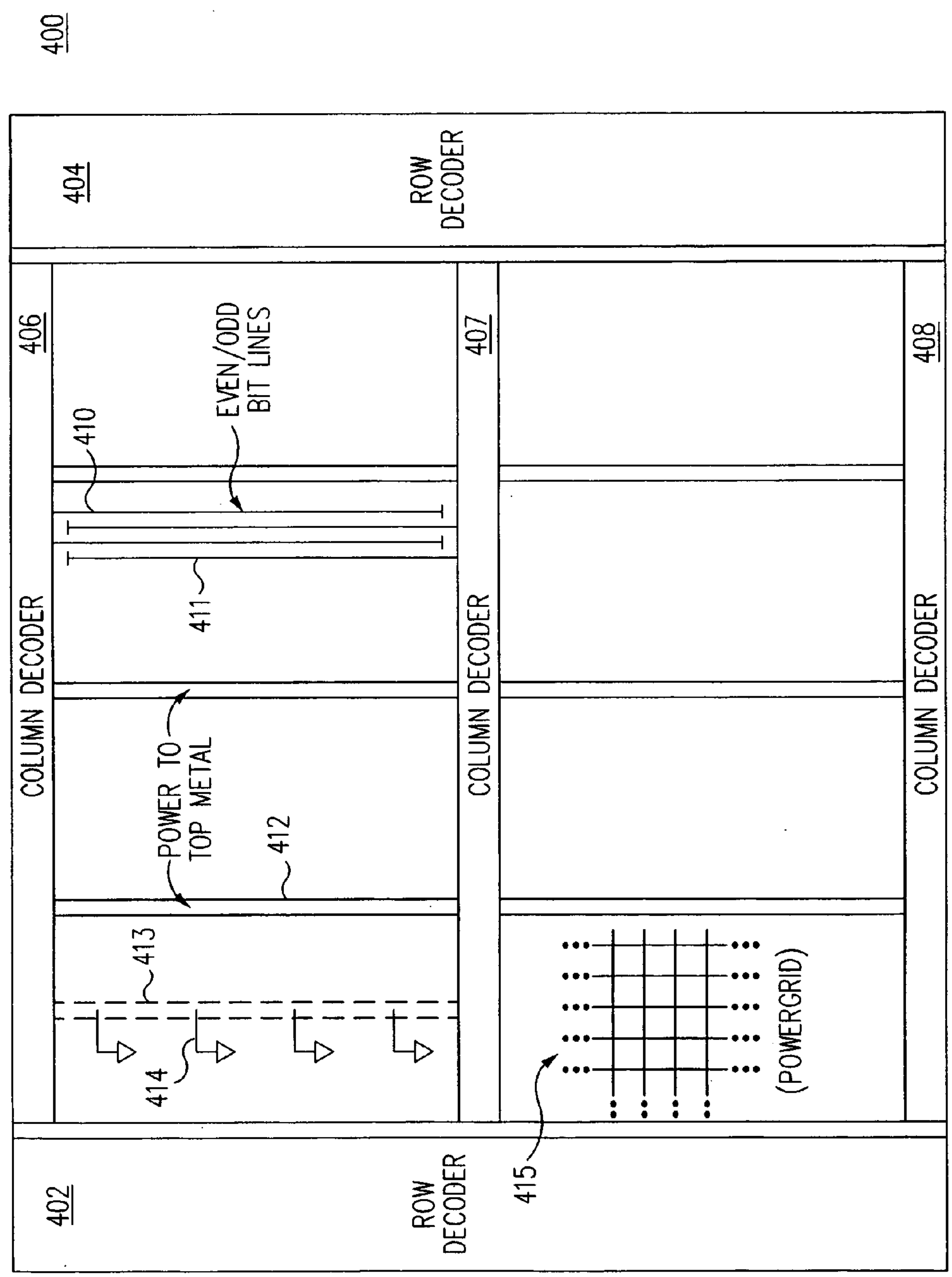
FIG. 14 is a block diagram of an exemplary memory array and certain associated support circuitry, in accordance with some embodiments of the present invention, having a row decoder on each of the left and right sides of the memory array, and having three column decoder and bit line circuits, respectively at the top, middle, and bottom of the array to support an upper and lower sub-array of 2:1 interleaved bit lines. An exemplary word line driver circuit bias line is shown with a distributed grounding circuit depicted, such as that shown in FIG. 13. Also depicted is a representation of a power grid for providing a robust local ground throughout the array to the respective distributed discharge circuits on the various word line driver circuit bias lines.

FIG. 14 is a block diagram of an exemplary memory array 400. Two row decoders 402, 404 alternately generate row select lines for the array, which each traverse across the array 400, half from the left row decoder 402, and half from the right row decoder 404. The word line driver circuits are spatially distributed beneath the memory array and make connection to the word lines by way of vertical connections, as described above. The memory array is divided into two sub-arrays by three column decoder and bit line circuits 406, 407, 408, respectively at the top, middle, and bottom of the array. The bit lines within each sub-array are also 2:1 interleaved to relax the pitch requirements of the column related circuitry. As an example, bit line 410 is associated with (i.e., driven and sensed by) the upper column circuit block 406, while bit line 411 is associated with the middle column circuits block 407. An exemplary word line driver circuit bias line 413 includes four distributed grounding or discharge circuits, represented by the ground connection labeled 414, such as that described in relation to FIG. 13. Also depicted is a representation of a power grid 415 for providing a robust local ground throughout the array to the respective distributed discharge circuits on the various word line driver circuit bias lines. In the exemplary array 400, the ground power grid 415 may be implemented as a 0.4 micron wide metal line every 9.6 microns (both vertically and horizontally), and makes connection to larger ground busses on a top layer of metal (above the memory array) within each of several power connection areas 412, which busses are then connected to one or more grounding pads to complete the path.

Figure 15:
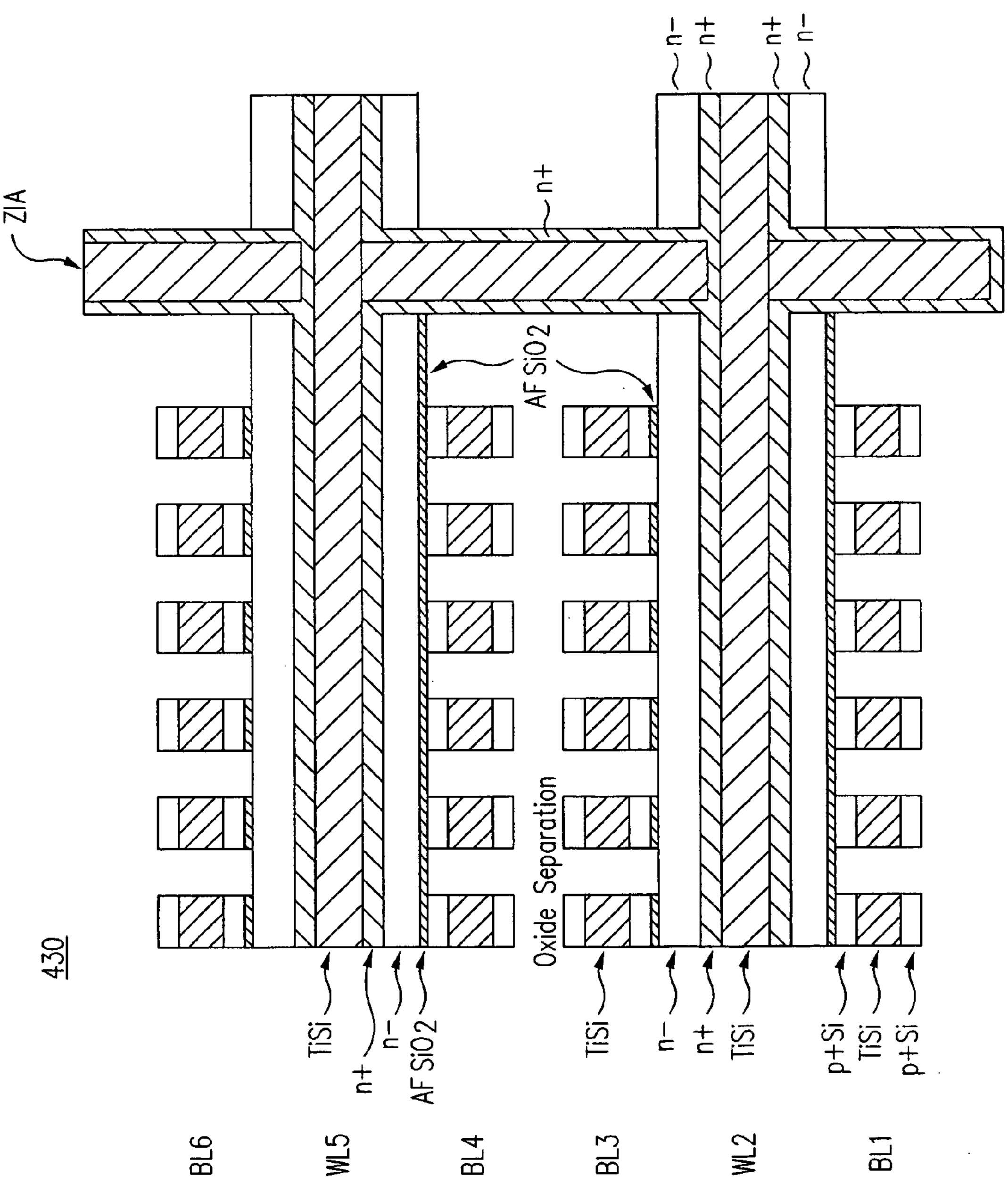
FIG. 15 is a cross-section diagram representing a half-mirrored memory array having two vertically-connected word line layers, each shared by two bit line layers, in accordance with certain embodiments of the present invention.

The configurations and embodiments described herein may be implemented using a variety of memory cell structures, such as those utilizing multiple layers of rail-stacks to form the word lines and bit lines as well as the memory cells therebetween. FIG. 15 is a cross-section diagram representing an exemplary half-mirrored memory array having two vertically-connected word line layers, each shared by two bit line layers, in accordance with certain embodiments of the present invention. Exemplary half-mirrored memory arrays are further described in "Three-Dimensional Memory" by Cleeves, U.S. patent application Ser. No. 10/185,508, filed on Jun. 27, 2002, which application is hereby incorporated by reference in its entirety. Other suitable memory cells may be formed as distinct pillars, each disposed between an associated word line segment and an associated bit line. Exemplary memory arrays incorporating such memory cells are described in "An Improved Method for Making High-Density Nonvolatile Memory," U.S. patent application Ser. No. 10/326,470, filed on Dec. 19, 2002, which application is hereby incorporated by reference in its entirety.

While the invention is not to be limited to any particular voltage ranges, in certain exemplary embodiments the nominal voltages for both read and write conditions are found in Table I below.

TABLE I

| Array Line | Write mode | Read mode |
|---|---|---|
| Bit Line - Selected | 9 volts | 2.4 volts |
| Word Line - Unselected | 8 volts | 2.4 volts |
| Bit Line - Unselected | 1 volt | Ground |
| Word Line - Selected | Ground | Ground |

Preferred biasing conditions are described further in "Method and Apparatus for Biasing Selected and Unselected Array Lines When Writing a Memory Array" by Scheuerlein, U.S. patent application Ser. No. 09/897,771, filed on Jun. 29, 2001, which application is hereby incorporated by reference in its entirety. Preferred programming methods which reduce disturb effects on half-selected and unselected memory cells are described in U.S. Pat. No. 6,822,903 to Scheuerlein, et al., entitled "Apparatus and Method for Disturb-Free Programming of Passive Element Memory Cells," the disclosure of which is hereby incorporated by reference in its entirety.

In certain embodiments, many sub arrays may be separately selected. Each selected sub array has at least one bit line at a selected bias level, and may have multiple selected bit lines associated with the same word line, but spread out on many of the word line segments of the selected word line. To limit the voltage drop along a given word line segment, preferably no more than one bit line is selected per word line segment. In various embodiments, there may be many unselected sub arrays as well, whose word line driver bias lines all remain at an unselected bias level.

As described above, the word line segments of an array block may be interleaved, where only half the word lines are connected to vertical connections at each of the shared edges of the array block to relax the required pitch of the vertical connections. Because the vertical connections are shared between the two array blocks (to save connection area) there are extra leakage paths in the memory array block adjacent to the selected block. In other embodiments, the word lines are not interleaved, which is more difficult to layout the vertical connections on the tighter pitch, but saves leakage power in the adjacent array block.

In certain embodiments, each word line segment may include at least one test cell for use in confirming that the word line segment (and the memory cells coupled thereto) is functional. Exemplary use of such test cells is described in U.S. Pat. No. 6,407,953 to Cleeves, which is incorporated herein by reference in its entirety.

As described in many of the embodiments described herein, each word line is preferably driven by a first device to a selected bias line and by a second device to an unselected bias line. The respective gate terminal of these first and second devices is controlled by a row decoder that is preferably shared by many array blocks, including both selected and unselected blocks. Moreover, the first and second devices are preferably opposite conductivity type devices. In certain preferred embodiments, the first device is an N-channel device to efficiently sink the current during programming of the selected word line segments. This is especially preferred when there are multiple bit lines selected during programming. The selected bias lines preferably have two pull down or discharge paths. A first pull down path includes series devices that pulls down slowly and snap-back free from high voltages during programming operations, and a second pull down path that is preferably a single device placed in multiple instances along the bias line for sinking the programming current. In other embodiments, the polarity of the voltage levels and the device conductivity types may be reversed.

In various embodiments, the vertical connections may connect to a single word line segment on a layer, or may be shared by more than one word line segment on a layer. For example, a respective word line segment in each of two adjacent array blocks may share the same vertical connection. Such sharing allows the word line pitch and vertical connection pitch to be at least twice the word line segment pitch, which is particularly advantageous for small memory cells such as passive element memory cells.

In certain embodiments, a single vertical connection makes connection with at least one word line segment on every word line layer. In other embodiments, each vertical connection may provide a connection to at least one word line segment on a subset of the word line layers, such as every other word line layer.

In certain embodiments, memory layers may be formed as a half-mirrored structure so that word lines (i.e., word line segments) are shared by more than one memory plane. For example, a half-mirrored memory array may include word line segments within a word line layer which are shared by a first bit line layer disposed above the word line layer and by a second bit line layer disposed below the word line layer, with the first and second bit line layers not shared with other word line layers. Similarly, another exemplary half-mirrored memory array may include bit line segments within a bit line layer which are shared by a first word line layer disposed above the bit line layer and by a second word line layer disposed below the bit line layer, with the first and second word line layers not shared with other bit line layers. In either a half-mirrored or fully-mirrored array structure, it is not necessarily the case that the two memory layers associated with a shared array line layer are vertically symmetrical (i.e., vertical mirror-images), even though certain embodiments described herein depict such symmetry.

In certain embodiments, the array blocks may be grouped into multiple sub-arrays. A very large memory array may be implemented as many sub-arrays, each having segmented word lines, and arranged in a checkerboard fashion as described in U.S. patent application Ser. No. 09/896,814, filed Jun. 29, 2001, entitled "Memory Device With Row and Column Decoder Circuits Arranged in a Checkerboard Pattern Under a Plurality of Memory Arrays," which application is hereby incorporated by reference in its entirety. Such a checkerboard arrangement places column-related circuitry beneath half of the sub-arrays, each supporting its own columns and those of a neighboring sub-array, and places row-related circuitry beneath the other half of the sub-arrays, each supporting its own rows and those of a neighboring sub-array.

In the various embodiments, the connections between memory layers are advantageously formed as a vertical connection to reduce the overall area consumed by such connections. However, the use of such terms herein as "vertical connection" should be interpreted to include any manner of making a connection between vertically displaced (e.g. adjacent) memory layers, whether using a separate via to connect each layer to its neighboring layer, whether such vias are stacked one atop another, whether each via is laterally displaced relative to the vias above and below it, or whether any other structure is used to fashion a connection between nodes on more than one memory layer. The invention is not limited to any particular form of "vertical connection," as different processes may result in more or less desirable choices for each process. Such a vertical connection may also be conveniently termed a "zia" to imply a via-type structure connecting more than one layer in the z-direction. Preferred zia structures and related methods for their formation are described in U.S. Pat. No. 6,534,403 to Cleeves, issued Mar. 18, 2003, the disclosure of which is hereby incorporated by reference in its entirety.

In various embodiments described herein, a number of memory cells per bit line segment has been assumed for convenience of description. It should be understood that, as with any memory array design, a number of factors may influence design decisions as to the number of memory cells per word line segment as well as the number of memory cells per bit line. For example, the number of memory cells per word line segment may be heavily influenced by the total leakage current which may affect a selected or unselected bit line, by resistance of the word line segment, or by capacitance of the bit line. Similarly, the number of array blocks and the number of memory planes are also a matter of engineering decision, and the exemplary configurations described herein are only examples of selected cases and not required configurations.

In addition, most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002 (now U.S. Pat. No. 6,856,572), and in "Tree Decoder Structure Particularly Well Suited to Interfacing Array Lines Having Extremely Small Layout Pitch," U.S. patent application Ser. No. 10/306,888, filed Nov. 27, 2002 (now U.S. Pat. No. 6,859,410), which applications are hereby incorporated by reference in their entirety.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines (e.g., including word line segments) and bit lines usually represent orthogonal array lines, and generally follow a common assumption in the art that word lines are driven and bit lines are sensed, at least during a read operation. Thus, the bit lines of an array may also be referred to as sense lines of the array. No particular implication should be drawn as to word organization by use of such terms. Moreover, as used herein, a "global array line" is an array line that connects to array line segments in more than one memory block, but no particular inference should be drawn suggesting such a global array line must traverse across an entire memory array or substantially across an entire integrated circuit.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, the memory cells may be comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell is preferred. Other types of memory arrays, such as MRAM and organic passive element arrays, may also be used. MRAM (magnetoresistive random access memory) is based on magnetic memory elements, such as a magnetic tunnel junction (MTJ). MRAM technology is described in "A 256 kb 3.0V 1T1 MTJ Nonvolatile Magnetoresistive RAM" by Peter K. Naji et al., published in the Digest of Technical Papers of the 2001 IEEE Intemational Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Woistenholme et al. and U.S. Pat. No. 4,646,266 to Ovshinsky et al., both of which are hereby incorporated by reference.

In various embodiments of the invention described herein, many different memory cell technologies are contemplated for use. Suitable three-dimensional antifuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. patent application Ser. No. 09/814,727 by Knall, et al, filed Mar. 21, 2001, entitled "Three-Dimensional Memory Array and Method of Fabrication"; U.S. patent application Ser. No. 09/928,536 by Johnson, filed Aug. 13, 2001, entitled "Vertically-Stacked, Field Programmable Nonvolatile Memory and Method of Fabrication"; U.S. patent application Ser. No. 10/185,508 by Cleeves, filed Jun. 27, 2002, entitled "Three Dimensional Memory"; and U.S. patent application Ser. No. 10/326,470 by Herner, et al, filed Dec. 19, 2002, entitled "An Improved Method for Making a High Density Nonvolatile Memory". Each of these enumerated disclosures is incorporated herein by reference in its entirety.

The directionality of various array lines in the various figures is merely convenient for ease of description of the two groups of crossing lines in the array. While word lines are usually orthogonal to bit lines, such is not necessarily required. Moreover, the word and bit organization of a memory array may also be easily reversed. As an additional example, portions of an array may correspond to different output bits of a given word. Such various array organizations and configurations are well known in the art, and the invention is intended to comprehend a wide variety of such variations. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As use herein, two different voltages which are "substantially equal" to each other have respective values which are close enough to cause substantially the same effect under the context at issue. Such voltages may be assumed to fall within approximately 0.5 volts of each other, unless the context requires another value.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

The invention claimed is:

1. An integrated circuit comprising a programmable memory cell array, said memory array comprising a plurality of segmented word lines and a plurality of bit lines, said word lines having an end-to-end resistance which is at least 10× lower than that of the bit lines.

2. The integrated circuit of claim 1 wherein the memory array comprises a three-dimensional passive element memory cell array.

3. The integrated circuit of claim 2 comprising anti-fuse memory cells.

4. The integrated circuit of claim 2 comprising fuse memory cells.

5. The integrated circuit of claim 2 wherein the array is configured to simultaneously program a group of at least two memory cells associated with a single word line.

6. The integrated circuit of claim 1 wherein:

each word line comprises at least one word line segment on each of at least two word line layers that are connected together; and each word line is operably coupled to an associated selected bias line traversing perpendicular to the word line segments.

7. The integrated circuit of claim 6 wherein each respective selected bias line is operably driven to a selected bias level by a respective first circuit arranged to initially drive the line from an unselected bias level toward the selected bias level, and by a second circuit for subsequently providing a lower impedance path to the selected bias level.

8. The integrated circuit of claim 7 wherein the respective second circuit for each respective selected bias line comprises a plurality of spatially distributed circuits operably coupling the respective selected bias line to a source of the selected bias level.

9. The integrated circuit of claim 2 wherein all word line segments for each respective word line are connected together by a respective single vertical connection.

10. The integrated circuit of claim 9 comprising word lines including a respective word line segment in each of two adjacent blocks of the memory array.

11. The integrated circuit of claim 6 wherein the word line segments on a given word line layer in each array block are interleaved.

12. The integrated circuit of claim 11 comprising word lines including a respective word line segment in each of two adjacent blocks of the memory array which share a vertical connection.

13. A computer readable medium encoding an integrated circuit, said encoded integrated circuit as recited in claim 1.

14. An integrated circuit comprising a three-dimensional memory cell array, said array comprising a plurality of segmented word lines, each word line comprising at least one word line segment on each of at least two word line layers that are connected together, and further comprising a plurality of bit lines each at least 10× greater in length than individual word line segments, each memory cell being read by driving an associated word line and sensing an associated bit line.

15. The integrated circuit of claim 14 further comprising at least three word line layers, wherein at least some segmented word lines comprise connected-together word line segments on a first group of one or more word line layers, and at least some segmented word lines comprise connected-together word line segments on a second group of one or more word line layers.

16. The integrated circuit of claim 14 wherein all word line segments for each respective word line are connected together by a respective single vertical connection.

17. The integrated circuit of claim 14 comprising anti-fuse memory cells.

18. The integrated circuit of claim 16 comprising word lines including a respective word line segment in each of two adjacent blocks of the memory array.

19. The integrated circuit of claim 16 wherein the word line segments on a given word line layer in each array block are interleaved.

20. The integrated circuit of claim 19 comprising word lines including a respective word line segment in each of two adjacent blocks of the memory array which share a vertical connection.

21. A computer readable medium encoding an integrated circuit, said encoded integrated circuit as recited in claim 14.

* * * * *

UNITED STATES PATENT AND TRADEMARK OFFICE

CERTIFICATE OF CORRECTION

PATENT NO. : 7,002,825 B2

APPLICATION NO. : 11/103184
DATED : February 21, 2006
INVENTOR(S) : Scheuerlein

It is certified that error appears in the above-identified patent and that said Letters Patent is hereby corrected as shown below:

Title page, Item [56], References Cited, OTHER PUBLICATIONS, line 3 the word "Maitreyee" should read -- Maitreyee Mahajani --.

Title page field (56): Page 2, U.S. PATENT DOCUMENTS, line 37, the word "Ikbahar" should read -- Ilkbahar --.

Title page field (56) Page 2, OTHER PUBLICATIONS, line 1, the word "1tIMTJ" should read -- 1T1MJT --.

Column 17, line 8, the words "1T1 MTJ" should read -- 1T1MTJ --.

Column 17, line 24, the word "Woistenholme" should read -- Wolstenholme --.

Signed and Sealed this

Twenty-ninth Day of August, 2006

JON W. DUDAS
*Director of the United States Patent and Trademark Office*